United States Patent
Koktan et al.

(10) Patent No.: US 8,938,579 B2
(45) Date of Patent: Jan. 20, 2015

(54) METHOD AND SYSTEM FOR USING RANGE BITMAPS IN TCAM ACCESS

(71) Applicants: Toby J. Koktan, Nepean (CA); Andre Poulin, Gatineau (CA); Michel Rochon, Kanata (CA)

(72) Inventors: Toby J. Koktan, Nepean (CA); Andre Poulin, Gatineau (CA); Michel Rochon, Kanata (CA)

(73) Assignee: Alcatel Lucent, Boulogne Billancourt (FR)

(*) Notice: Subject to any disclaimer, the term of this patent is extended or adjusted under 35 U.S.C. 154(b) by 238 days.

(21) Appl. No.: 13/630,157

(22) Filed: Sep. 28, 2012

(65) Prior Publication Data

US 2014/0095782 A1    Apr. 3, 2014

(51) Int. Cl.
*G11C 15/00* (2006.01)
*G06F 12/00* (2006.01)
*H04L 12/773* (2013.01)

(52) U.S. Cl.
CPC ........... *G11C 15/00* (2013.01); *H04L 45/60* (2013.01)
USPC ............... 711/108; 711/E12.001; 370/392; 365/49.1

(58) Field of Classification Search
None
See application file for complete search history.

(56) References Cited

U.S. PATENT DOCUMENTS

| | | | | |
|---|---|---|---|---|
| 6,717,946 | B1 * | 4/2004 | Hariguchi et al. | 370/392 |
| 6,775,737 | B1 * | 8/2004 | Warkhede et al. | 711/108 |
| 7,193,997 | B2 * | 3/2007 | Van Lunteren et al. | 370/392 |
| 8,576,841 | B2 * | 11/2013 | Ramaraj et al. | 370/389 |
| 8,675,664 | B1 * | 3/2014 | Kamath et al. | 370/395.53 |
| 2002/0191605 | A1 * | 12/2002 | Lunteren et al. | 370/389 |
| 2013/0003727 | A1 * | 1/2013 | Ramaraj et al. | 370/389 |

OTHER PUBLICATIONS

Lakshman et al., High-Speed Policy-based Packet Forwarding Using Efficient Multi-dimensional Range Matching. Bell Laboratories (http://ect.bell-labs.com/who/stiliadi/papers/filter.pdf) [viewed on Jan. 23, 2012.], 1998.

Hao Che et al., DRES: Dynamic Range Encoding Scheme for TCAM Coprocessors. IEEE Transactions on Computers, vol. 57, No. 7, Jul. 2008. pp. 902-915.

Karthik Lakshminarayanan et al., Algorithms for Advanced Packet Classification with Ternary CAMs. SIGCOMM'05, Aug. 21-26, 2005, Philadelphhia, Pennsylvania, USA.

Jan van Lunteren et al., Dynamic Multi-Field Packet Classification. Proceedings of the IEEE Global Telecommunications Conference GLOBECOM'02, vol. 3, pp. 2215-2219, Taipei, Taiwan, Nov. 2002.

* cited by examiner

*Primary Examiner* — Kevin Verbrugge
(74) *Attorney, Agent, or Firm* — Kramer Amado P.C.

(57) ABSTRACT

Various exemplary embodiments relate to a method and related network node including one or more of the following: determining that a first search value is associated with a first range field; determining a first bitmap associated with the first search value, wherein the first bitmap indicates at least one range encompassing the first search value; generating a search key based on the first bitmap; and accessing the ternary content addressable memory based on the search key.

20 Claims, 4 Drawing Sheets

| 300 ↘ | 310 | 320 | 330 | 340 |
|---|---|---|---|---|
| | Rule Number | Source Port | Destination Port | ... |
| 350 | 1 | 1-5 | 10 | ... |
| 360 | 2 | 2 | 5-7 | ... |
| 370 | 3 | * | 11-15 | ... |
| 380 | 4 | 4-7 | * | ... |
| 390 | ... | ... | ... | ... |

*FIG. 3*

| 400 ↘ | 410 | 420 |
|---|---|---|
| | Source Port | Bitmap |
| 430 | 0 | 0000 |
| 431 | 1 | 0001 |
| 432 | 2 | 0011 |
| 433 | 3 | 0001 |
| 434 | 4 | 1001 |
| 435 | 5 | 1001 |
| 436 | 6 | 1000 |
| 437 | 7 | 1000 |
| 438 | ... | ... |

*FIG. 4*

| 500 ↘ | Content | 560 |
|---|---|---|
| 510 | ...1000  0**1  1001  ****  1110 | ***1 |
| 520 | ...11**  11**  *011  0110  1101 | **1* |
| 530 | ...11*0  *100  0000  11**  110* | **** |
| 540 | ...1111  10**  1011  *10*  *001 | 1*** |
| 550 | ... | |

*FIG. 5*

METHOD AND SYSTEM FOR USING RANGE BITMAPS IN TCAM ACCESS

TECHNICAL FIELD

Various exemplary embodiments disclosed herein relate generally to memory access.

BACKGROUND

Ternary content addressable memory (TCAM) devices are commonly employed in applications such as high performance communication systems for functions including fast routing lookups, packet classification, and filtering. TCAM searches compare header fields of incoming packets against all entries in the forwarding table, filter, or classifier database in parallel. A result may then be returned from the TCAM with a fixed latency regardless of record location and the total number of records.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of a preferred exemplary embodiment adequate to allow those of ordinary skill in the art to make and use the inventive concepts will follow in later sections.

Various exemplary embodiments relate to a method for accessing a ternary content addressable memory, the method including: determining that a first search value is associated with a first range field; determining a first bitmap associated with the first search value, wherein the first bitmap indicates at least one range encompassing the first search value; generating a search key based on the first bitmap; and accessing the ternary content addressable memory based on the search key.

Various exemplary embodiments relate to an access control device including: a network interface configured to receive a message; a ternary content addressable memory; and a network processor configured to: identify a field of the message as a first search value associated with a first range field, determine a first bitmap associated with the first search value, wherein the first bitmap indicates at least one range encompassing the first search value, generate a search key based on the first bitmap, access the ternary content addressable memory based on the search key, and based on the access of the ternary content addressable memory producing a match, performing at least one match action with respect to the message.

Various exemplary embodiments relate to a non-transitory machine-readable storage medium encoded with instructions for accessing a ternary content addressable memory, the medium including: instructions for determining that a first search value is associated with a first range field; instructions for determining a first bitmap associated with the first search value, wherein the first bitmap indicates at least one range encompassing the first search value; instructions for generating a search key based on the first bitmap; and instructions for accessing the ternary content addressable memory based on the search key.

Various embodiments are described wherein determining the first bitmap associated with the first search value includes accessing a record of a lookup table, wherein the record includes the first search value and a pre-computed bitmap for the first search value, wherein the pre-computed bitmap is used as the first bitmap.

Various embodiments are described wherein determining the first bitmap associated with the first search value includes computing the first bitmap by comparing the first search value to a plurality of ranges.

Various embodiments additionally include receiving a message, wherein the message includes the first search value; and forwarding the message to another device based on the accessing the ternary content addressable memory resulting in a match.

Various embodiments are described wherein the search key additionally includes a value copied from the message.

Various embodiments are described wherein: the first bitmap includes a plurality of bits, a first bit of the plurality of bits indicates whether the first search value is encompassed by a first range; and a second bit of the plurality of bits indicates whether the first search value is encompassed by a second range.

Various embodiments are described wherein: the ternary content addressable memory includes a plurality of records; and a first record of the plurality of records associated with the first range, wherein the first record includes: a first bit position associated with the first bit of the plurality of bits, a bit at the first bit position being set equal to the first bit of the plurality of bits, and a second bit position associated with the second bit of the plurality of bits, a bit at the second bit position being set to a wildcard value.

Various embodiments additionally include determining that a second search value is associated with a second range field; and determining a second bitmap associated with the second search value, wherein generating the search key based on the first bitmap includes generating a search key based on the first bitmap and the second bitmap.

Various embodiments are described wherein generating the search key based on the first bitmap and the second bitmap includes: combining the first bitmap with at least the second bitmap to produce a final range check bitmap; and including the final range check bitmap in the search key.

Various embodiments are described wherein generating the search key based on the first bitmap comprises including the first bitmap in the search key.

BRIEF DESCRIPTION OF THE DRAWINGS

In order to better understand various exemplary embodiments, reference is made to the accompanying drawings, wherein:

FIG. 3 illustrates an exemplary rule set including range fields;

FIG. 4 illustrates an exemplary look-up table including range field bitmaps;

FIG. 5 illustrates an exemplary data arrangement for storing TCAM content.

To facilitate understanding, identical reference numerals have been used to designate elements having substantially the same or similar structure or substantially the same or similar function.

DETAILED DESCRIPTION

Various applications may define ranges of values for which rules or actions are applicable. For example, for an access control list (ACL), user-configured rules may specify source and destination port ranges which are white listed. Implementation of such ranges may be difficult, however, because ternary content addressable memory (TCAM) searching is an "exact match" process. Many implementations seek to implement such ranges by defining multiple TCAM entries to encompass every value in the range. This approach, however, may lead to a "record explosion," requiring a maximum of (2*W−2) records, where W represents the number of bits in the range fields. Rules utilizing multiple range fields further exacerbate the record explosion problem. Due to the relatively high cost of TCAM devices, it would be desirable to provide a method of implementing value ranges in a TCAM search without requiring the use of additional TCAM memory.

Figure 1:
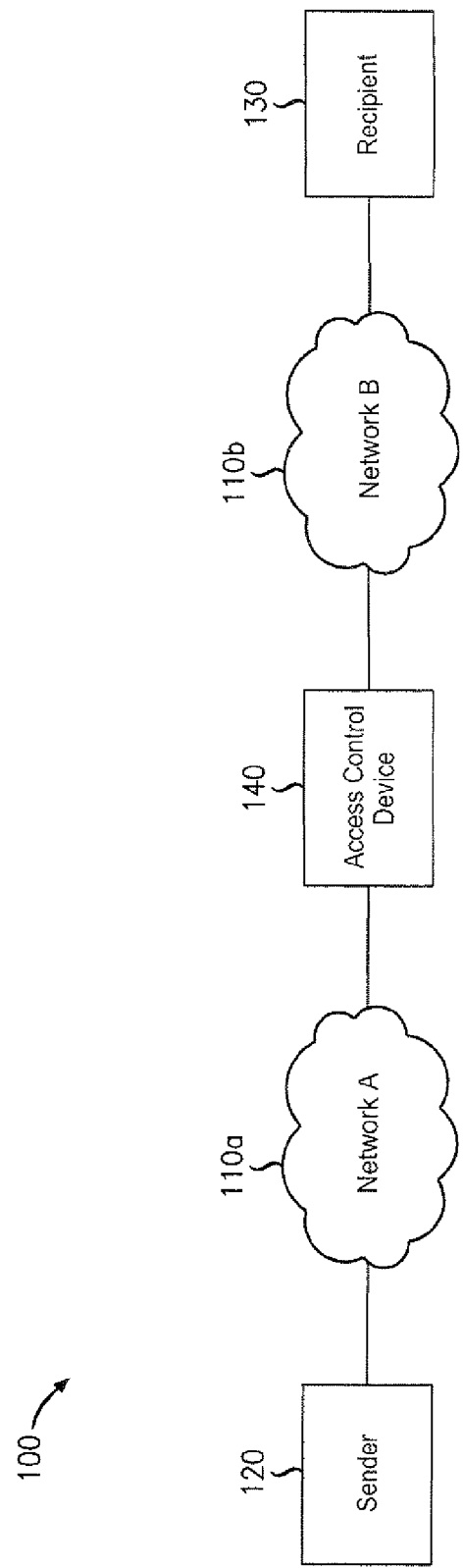
FIG. 1 illustrates an exemplary environment for an access control device utilizing a ternary content addressable memory (TCAM)

FIG. 1 illustrates an exemplary environment 100 for an access control device 140 utilizing a TCAM. The exemplary environment 100 may be a system of computing devices such as a sender device 120, a recipient device 130, and the access control device 140 interconnected via one or more networks 110a,b. Networks 110a,b may constitute the same network or two or more diverse networks. For example, in various embodiments, exemplary system 100 may include a 3G, long term evolution (LTE), or other mobile carrier network. In such embodiments, network A 110a may include the carrier network while network B 110b may be a larger network, such as the Internet. In other embodiments, both networks 110a, b may constitute the same network such as the Internet. Various other arrangements of the devices 120, 130, 140 with regard to various networks will be apparent.

The sender device 120 and the recipient device 130 may each be computer devices capable of communicating with each other utilizing various messages, such as packets or other datagrams. The sender device 120 and the recipient device 130 may each be a personal computer, laptop, mobile device, smart phone, tablet, server, and/or blade configured for such communication.

The access control device 140 may be a device configured to receive and forward traffic between the sender device 120 and the recipient device 130. For example, the access control device 140 may be a router device, such as an Alcatel-Lucent 7705 service aggregation router (SAR), interconnecting two portions of a mobile carrier network. The access control device 140 may also implement various access control rules with regard to traffic traversing the access control device 140. For example, the access control device 140 may only forward traffic directed to a destination port within a specified range of destination ports. It will be understood that various embodiments may utilize additional and more complex access control rules for determining which traffic should be forwarded. As will be explained in further detail below, the access control device 140 may utilize a TCAM to determine whether a received message matches any access control rules.

It will be understood that, while various embodiments are described with respect to an intermediate access control device, that the methods and configurations described herein may be applicable to other environments. For example, the recipient device 130 may implement a TCAM to provide access control at an endpoint of communication. As another example, the access control device 140 may utilize similar methods for TCAM accesses in relation to routing lookups and/or packet classifications. Other applications of range field searching in TCAMs will be apparent.

Figure 2:
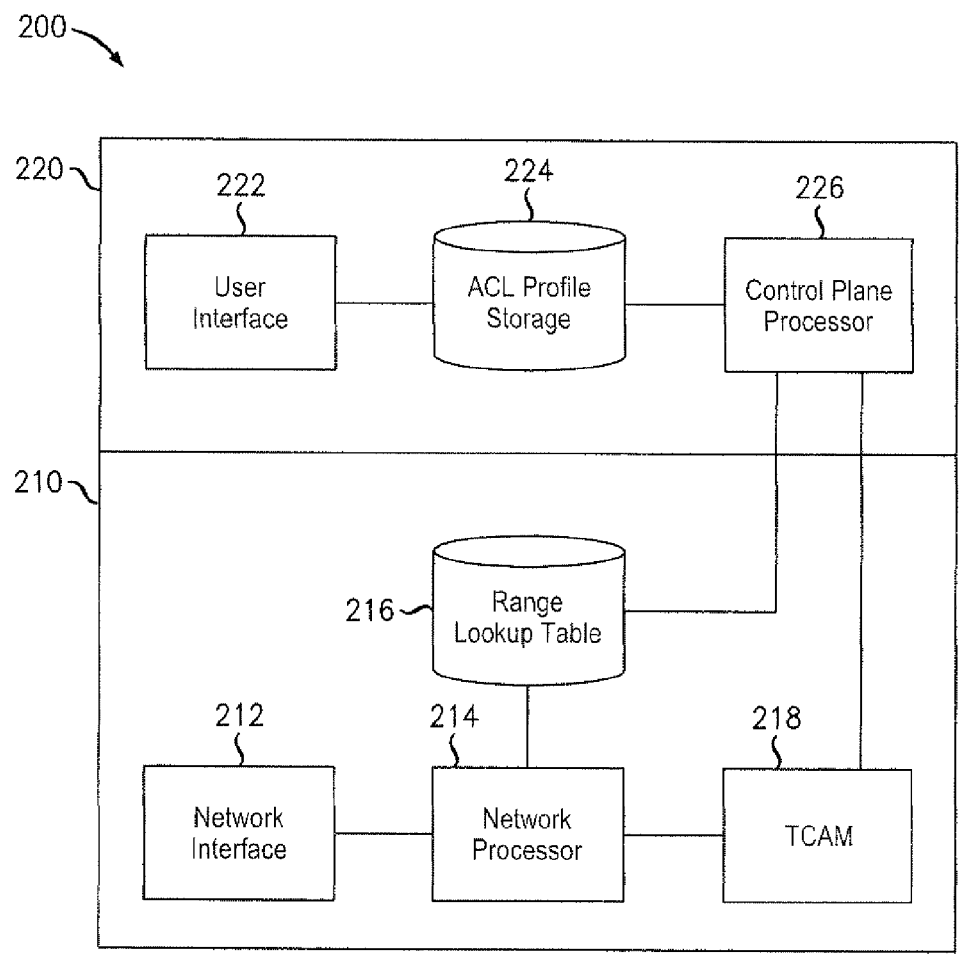
FIG. 2 illustrates an exemplary access control device utilizing a TCAM.

FIG. 2 illustrates an exemplary access control device 200 utilizing a TCAM 218. The access control device 200 may correspond to the access control device 140 of the exemplary environment 100. As such, the access control device 200 may constitute a router, a gateway device, or some other intermediate device that processes messages transferred between at least two devices. The access control device may include a data plane 210 and a control plane 220.

The data plane 210 may include a network interface 212, a network processor 214, a range lookup table 216, and a TCAM 218. It will be understood that the access control device may include numerous additional components such as, additional network interfaces 212, additional network processors 214 and/or additional TCAMs 218.

The network interface 212 may include an interface including hardware or executable instructions encoded on a machine-readable storage medium configured to communicate with other devices. For example, the network interface 212 may include an Ethernet or TCP/IP interface. In various embodiments, the network interface 212 may include multiple physical ports or may communicate according to multiple communications protocols.

The network processor 214 may include a processor configured to process and forward messages received via the network interface 212. As used herein, the term "processor" will be understood to encompass microprocessors, field-programmable gate arrays (FPGAs), application-specific integrated circuits (ASICs), and/or other similar hardware devices. In processing a message, the network processor 214 may be configured to determine whether the message should be forwarded or dropped by determining whether any previously-defined access control rule matches the current message. The network processor 214 may make such determination by accessing the range lookup table 216 and/or the TCAM 218.

As a first step in determining the applicability of an access control rule, the network processor 214 may first determine a bitmap for the message to correspond to a range field. For example, one or more access control rules may specify a range of destinations ports to which the rule applies. The network processor may determine the applicable bitmap by accessing the range lookup table 216 to retrieve a pre-computed bitmap for the value carried by the message. Alternatively, the network processor 214 may, at run-time, compute a bitmap by comparing the value carried by the message to one or more ranges defined for the access control rules.

After determining the applicable bitmap, the network processor may construct a search key using the bitmap. In various embodiments, the bitmap may constitute the search key in its entirety. In other embodiments, the search key may include the bitmap, additional bitmaps for other range fields, additional values extracted from the message, and/or information about the receipt of the message reported by the network interface 212 (e.g., which port received the message). After constructing the search key, the network processor 214 may pass the search key to the TCAM 218. If the TCAM returns a match, the network processor may proceed to forward the packet. In various alternative embodiments, the address returned by the TCAM may point to or otherwise indicate an action to be taken with respect to the message.

The range lookup table 216 may be any machine-readable medium capable of storing one or more lookup tables for determining a bitmap for use in searching the TCAM 218. Accordingly, the range lookup table 216 may include a machine-readable storage medium such as random-access memory (RAM), magnetic disk storage media, optical storage media, flash-memory devices, and/or similar storage media. Exemplary contents for the range lookup table 216 will be described in greater detail below with respect to FIG. 4. In various embodiments wherein the network processor 214 calculates bitmaps at run-time, the range lookup table 216 may additionally or alternatively store a plurality of ranges for use by the network processor 214.

The TCAM 218 may be a TCAM device configured to search and locate records based on provided content. Upon locating provided content, the TCAM 218 may return the address of the located content within the TCAM 218. For each content record, the TCAM may additionally include a bitmask that specifies whether each bit of the content record is a wildcard, or "don't care" value. Such wildcard values may match both a "0" and a "1" bit during a TCAM search. The TCAM may be configured to store at least one bit corresponding to a bitmap of the range lookup table 216, as will be explained in greater detail below. Exemplary contents of the TCAM will be described in greater detail below with respect to FIG. 5.

The control plane 220 may include a user interface 222, an access control list (ACL) profile storage 224, and a control plane processor 226. The user interface 222 may include hardware and/or executable instructions encoded on a machine-readable medium configured to enable a user to modify the contents of the ACL profile storage 224. The user interface 222 may include a keyboard, a mouse, a monitor, a network interface (such as network interface 212 or another network interface not shown), a command line interface, and/or a graphical user interface. The user interface 222 may enable an administrator or other user to create, modify, and delete access control rules for use by the access control device 200.

The ACL profile storage 224 may be any machine-readable medium capable of storing one or more access control rules. Accordingly, the ACL profile storage 224 may include a machine-readable storage medium such as read-only memory (ROM), random-access memory (RAM), magnetic disk storage media, optical storage media, flash-memory devices, and/or similar storage media. Exemplary contents for the ACL profile storage 224 will be described in greater detail below with respect to FIG. 3. In various embodiments, the ACL profile storage 224 may share at least one storage device in common with the range lookup table 216. For example, the ACL profile storage 224 and the range lookup table 216 may occupy different areas on a single storage device.

The control plane processor 226 may include a processor configured to translate the access control rules stored in the ACL profile storage 224 into lookup table entries in the range lookup table 216 and content records in the TCAM 218. Accordingly, the control plane processor 226 may generate bitmaps for potential values of range fields defined in the ACL profile storage 224 and/or generate search keys for storage in the TCAM 218. Alternatively, the control plane processor 226 may generate records of the various ranges included in the access control rules for use by the network processor in computing bitmaps at runtime. Such preprocessing of access control rules may be performed by the control plane processor 226 at periodic intervals, when the contents of the ACL profile storage 224 is changed, and/or when the control plane processor 226 receives an instruction via the user interface 222.

FIG. 3 illustrates an exemplary rule set 300 including range fields. The rule set 300 may store a number of access control rules and may correspond to the contents of the ACL profile storage 224 of the exemplary access control device 200. The rule set 300 may include a rule number field 310, a source port field 320, a destination port field 330, and a plurality of additional fields 340. The rule number field 310 may indicate a number or other identifier uniquely assigned to an access control rule. The source port field 320 may store an indication of one or more source ports to which a rule may apply. The source port field 320 may be a range field and, as such, a value for the source port field 320 may specify a range of source ports to which a rule applies. The destination port field 330 may store an indication of one or more destination ports to which a rule may apply. The destination port field 330 may also be a range field and, as such, a value for the destination port field 330 may specify a range of destination ports to which a rule applies. The rule set 300 may store a plurality of additional fields 340 useful in defining a search key. For example, the additional fields 340 may include a source address field, a destination address field, a receipt interface identifier, and/or a plurality of other message header field or interface values.

As an example, record 350 may indicate that for rule number "1" to apply, a message should carry a destination port of "10" and a source port between "1" and "5." As another example, record 360 may indicate that for rule number "2" to apply, a message should carry a source port of "2" and a destination port between "5" and "7." Values may also be specified as wildcard or "don't care" values in a field. For example, record 370 may indicate that for rule number "3" to apply, a message should carry a destination port between "11" and "15," without any regard for the value of the source port. As another example, record 380 may indicate that for rule number "4" to apply, a message should carry a source port between "4" and "7," without any regard for the value of the destination port. The rule set 300 may include numerous additional rule records 390.

FIG. 4 illustrates an exemplary lookup table 400 including range field bitmaps. The lookup table may correspond to the source port field of rule set 300 and may describe partial contents of the range lookup table 216 of the exemplary access control device 200. The range lookup table 216 may include additional lookup tables that correspond to other range fields such as, for example, destination port field 330 of rule set 300.

The lookup table 400 may include a source port field 410 indicating a source port value to which an entry applies and a bitmap field 420 indicating a bitmap to be used for the applicable source port value. The bitmap stored in bitmap field 420 may include a bit position for each access control rule. For example, assuming that only rule records 350-380 were stored in the ACL profile storage 224, the bitmap stored in bitmap field 420 may be four bits long. As shown, the last bit may correspond to rule number "1," the second to last bit may correspond to rule number "2," and so on. As will be understood, the last bit may be the most significant bit, while the first bit may be the least significant bit. Alternatively, the last bit may be the least significant bit, while the first bit may be the most significant bit. Various alternative correspondences between bit positions and rules will be apparent. As such, a bitmap may indicate, through the position of each set bit, which rules may possibly match a message carrying the corresponding source port value.

As an example, table entry 430 may indicate that for a source port value of "0," a bitmap of "0000" should be used because the value "0" does not match the value "2" or either of the ranges "1-5" or "4-7," as defined by the rule set 300. With regard to the wildcard source port value for rule number "3," the bitmap may store a 0 or a 1 in various implementations. The value in the bit position corresponding to rule number "3" may be inconsequential because, as will be seen below with respect to FIG. 5, the control plane may set this value in the TCAM as a wildcard or "don't care" value. In various alternative embodiments, the TCAM may instead enforce the bit position corresponding to rule "3" to be set to "1." In such embodiments, the bitmap for entry 430 may instead be "0100."

As another example, table entry 431 may indicate that for a source port of "1," a bitmap of "0001" should be used. The final bit of the bitmap may be set to "1" because the source port value of "1" may fall within the range of "1.5" as defined by record 350 of the rule set 300. As yet another example, table entry 432 may indicate that for a source port of "2," a bitmap of "0011" should be used because the value "2" may match both the range "1-5" and the specified value of "2" as defined by the rule set 300. Thus, a source port of 2 may match both rule records 350,360. It will be understood that the message carrying such a source port may not be a full match for both rules based on other values. For example, the message may carry a destination port of 10, in which case rule record 360 may not apply to the message. The meanings of additional entries 433-438 will be apparent in view of the foregoing.

FIG. 5 illustrates an exemplary data arrangement 500 for storing TCAM content. The exemplary data arrangement 500 may correspond to the content of the TCAM 218 of the access control device 200 and may include a plurality of content records 510-550, each including a series of bits set to "1," "0", or "*." The value "*" may indicate a wildcard or "don't care" value which will match any bit value. It will be appreciated that each content record 510-550 may include a key portion indicating the bit values to be matched and a bitmask portion indicating which values are "don't care values." Thus, for example, a key portion of "1100" and a bitmask portion of "0110" may correspond to a content record value of "*10*."

Each content record 510-550 may include a bitmap portion 560 that corresponds to a range bitmap. For example, the bitmap portion 560 may correspond to the source port bitmaps stored in lookup table 400. Each content record 510-550 may include additional bitmap portions corresponding to other range fields such as, for example, bitmaps associated with a destination port. As shown, the bitmap portion 560 of content record 510 may include the value "*1." As such, any bitmap including a set last bit may match this portion of the content record. Such a bitmap may be the result of receiving a message including a source port value between 1 and 5, as specified by lookup entries 431-435**.

As another example, the bitmap portion of content record 530 may include the value "**," indicating that any bitmap would match this portion of the content record. Thus, any received message, regardless of the included source port, would match the bitmap portion of the content record 530. The meaning of exemplary content records 520, 540 will be apparent in view of the foregoing. The data arrangement 500 may include numerous additional content records 550**.

Figure 6:
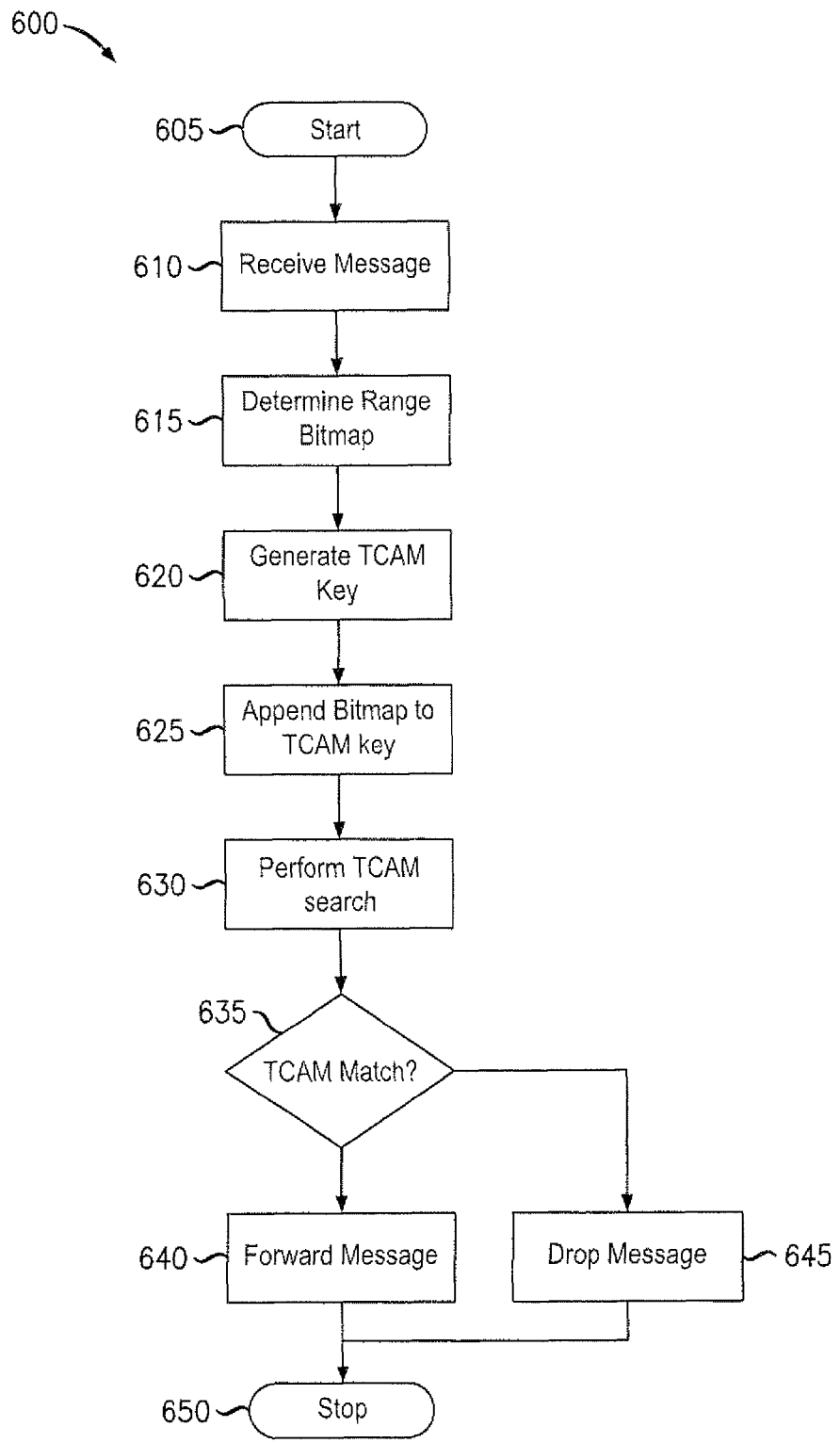
FIG. 6 illustrates an exemplary method for searching a TCAM.

FIG. 6 illustrates an exemplary method 600 for searching a TCAM. The exemplary method may be performed by a network processor 214 of the access control device 200. The method 600 may begin in step 605 and proceed to step 610 where the access control device 200 may receive a message such as a packet or other datagram. Next, in step 615, the access control device 200 may determine any range bitmaps associated with one or more search values carried by the message. For example, the access control device 200 may access a lookup table to retrieve a pre-processed bitmap or may compare the search value to one or more ranges to compute the bitmap in real time. In various embodiments, the access to the lookup table may be a direct memory lookup. As such, the search value, such as the source port, may be used as an index into the lookup table to obtain a pre-processed bitmap. Next, in step 620, the access control device 200 may generate a TCAM search key based on the bitmap. The TCAM search key may include the bitmap, one or more additional bitmaps, and/or one or more values retrieved from the packet, the receipt interface, or elsewhere. In various embodiments, one or more rules may utilize multiple range bitmaps. Such multiple range bitmaps may exist separately within the TCAM search key, or alternatively, combined together using a logical AND operation to form a single bitmap. Further, in various alternative embodiments, such as those combining bitmaps together, a range having a wildcard value may be represented as a "1" instead of a "0" in a bitmap. For example, the bitmap for table entry 430 of look-up table 400 may instead read "0100" because the second bit position is associated with a wildcard value.

In various embodiments wherein a search key is associated with multiple bitmaps because an access control rule utilizes multiple range fields, the access control device 200 may combine the bitmaps using an "AND" logical operation. The resulting final range check result bitmap may then only include a bit set to "1" when all fields with range checks are in range. For example, if a message has a first bitmap of "0101" for a first range field and a bitmap of "0011" for a second range field, a combined bitmap may be "0001" because the message only matched both range checks for the first access control rule. Alternatively, the TCAM may simply be configured to utilize search keys including multiple separate bitmaps.

After generating the search key, the access control device 200 may, in step 630, perform a TCAM search based on the search key. In step 635, the access control device 200 may determine whether the TCAM search resulted in a match. If so, the access control device 200 may, in step 640, proceed to further process and forward the message toward its destination. In various embodiments, the access control device 200 may perform additional or alternative match actions in step 640. For example, the access control device may drop, reject, alter, log, copy, record statistics, and/or redirect a message based on a TCAM match. Such match actions may be configurable by an operator of the access control device. If, on the other hand, the TCAM search did not result in a match, the access control device 200 may, in step 645, drop the message because no access control rule matches the message. The method 600 may then proceed to end in step 650.

Various modifications to method 600 will be apparent. For example, the access control device 200 may alternatively or additionally implement a filter list indicating packets to be dropped. In such an embodiment, step 640 may be swapped with step 645. As another alternative, instead of dropping a message, the access control device 200 may send a rejection message to the sender device in step 645.

According to the foregoing, various embodiments enable the use of value ranges in TCAM entries without requiring very large amounts of TCAM memory. By utilizing a bitmap indicating which ranges a search value matches, a single TCAM entry may be utilized for each such range, obviating the need for multiple TCAM entries to cover every possible value falling within a specified range. Additional advantages of the methods described herein will be apparent in view of the foregoing.

It should be apparent from the foregoing description that various exemplary embodiments of the invention may be implemented in hardware or firmware. Furthermore, various exemplary embodiments may be implemented as instructions stored on a machine-readable storage medium, which may be read and executed by at least one processor to perform the operations described in detail herein. A machine-readable storage medium may include any mechanism for storing information in a form readable by a machine, such as a personal or laptop computer, a server, or other computing device. Thus, a tangible and non-transitory machine-readable storage medium may include read-only memory (ROM), random-access memory (RAM), magnetic disk storage media, optical storage media, flash-memory devices, and similar storage media.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in machine readable media and so executed by a computer or processor, whether or not such computer or processor is explicitly shown.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A method for accessing a ternary content addressable memory, the method comprising:
   determining that a first search value is associated with a first range field;
   determining a first bitmap associated with the first search value, wherein the first bitmap includes a first bit that indicates a first range encompassing the first search value;
   generating a search key based on the first bitmap; and
   accessing the ternary content addressable memory based on the search key.

2. The method of claim 1, wherein determining the first bitmap associated with the first search value comprises accessing a record of a lookup table, wherein the record includes the first search value and a pre-computed bitmap for the first search value, wherein the pre-computed bitmap is used as the first bitmap.

3. The method of claim 1, wherein determining the first bitmap associated with the first search value comprises computing the first bitmap by comparing the first search value to a plurality of ranges.

4. The method of claim 1, further comprising:
   receiving a message, wherein the message includes the first search value; and
   forwarding the message to another device based on the accessing the ternary content addressable memory resulting in a match.

5. The method of claim 4, wherein the search key additionally includes a value copied from the message.

6. The method of claim 1, wherein:
   the first bitmap includes a plurality of bits,
   a first bit of the plurality of bits indicates whether the first search value is encompassed by the first range; and
   a second bit of the plurality of bits indicates whether the first search value is encompassed by a second range.

7. The method of claim 6, wherein:
   the ternary content addressable memory includes a plurality of records; and
   a first record of the plurality of records associated with the first range, wherein the first record includes:
      a first bit position associated with the first bit of the plurality of bits, a bit at the first bit position being set equal to the first bit of the plurality of bits, and
      a second bit position associated with the second bit of the plurality of bits, a bit at the second bit position being set to a wildcard value.

8. The method of claim 1, further comprising:
   determining that a second search value is associated with a second range field; and
   determining a second bitmap associated with the second search value,
   wherein generating the search key based on the first bitmap comprises generating a search key based on the first bitmap and the second bitmap.

9. The method of claim 8, wherein generating the search key based on the first bitmap and the second bitmap comprises:
   combining the first bitmap with at least the second bitmap to produce a final range check bitmap; and
   including the final range check bitmap in the search key.

10. The method of claim 1 wherein generating the search key based on the first bitmap comprises including the first bitmap in the search key.

11. An access control device comprising:
   a network interface configured to receive a message;
   a ternary content addressable memory; and
   a network processor configured to:
      identify a field of the message as a first search value associated with a first range field, determine a first bitmap associated with the first search value, wherein the first bitmap at least one includes a first bit that indicates a first range encompassing the first search value,
      generate a search key based on the first bitmap,
      access the ternary content addressable memory based on the search key, and
      based on the access of the ternary content addressable memory producing a match, performing at least one match action with respect to the message.

12. The access control device of claim 11, further comprising:
   a storage configured to store a lookup table, wherein a record of the lookup table includes the first search value and a pre-computed bitmap for the first search value,
   wherein, in determining the first bitmap associated with the first search value, the network processor is configured to use the pre-computed bitmap as the first bitmap.

13. The access control device of claim 11, further comprising:
   a storage configured to store a plurality of ranges associated with the first search value,
   wherein, in determining the first bitmap associated with the first search value, the network processor is configured to compute the first bitmap by comparing the first search value to the plurality of ranges.

14. The access control device of claim 13, wherein the search key additionally includes a value copied from the message.

15. The access control device of claim 11, wherein:
   the first bitmap includes a plurality of bits,
   a first bit of the plurality of bits indicates whether the first search value is encompassed by the first range; and
   a second bit of the plurality of bits indicates whether the first search value is encompassed by a second range.

16. The access control device of claim 15, wherein:
the ternary content addressable memory includes a plurality of records; and
a first record of the plurality of records associated with the first range, wherein the first record includes:
- a first bit position associated with the first bit of the plurality of bits, a bit at the first bit position being set equal to the first bit of the plurality of bits, and
- a second bit position associated with the second bit of the plurality of bits, a bit at the second bit position being set to a wildcard value.

17. The access control device of claim 11, wherein the network processor is further configured to:
determine that a second search value is associated with a second range field; and
determine a second bitmap associated with the second search value,
wherein, in generating the search key based on the first bitmap, the network processor is configured to generate a search key based on the first bitmap and the second bitmap.

18. The access control device of claim 17, wherein, in generating the search key based on the first bitmap and the second bitmap, the network processor is configured to:
combine the first bitmap with at least the second bitmap to produce a final range check bitmap; and
include the final range check bitmap in the search key.

19. The access control device of claim 11, wherein, in generating the search key based on the first bitmap, the network processor is configured to include the first bitmap in the search key.

20. A non-transitory machine-readable storage medium encoded with instructions for accessing a ternary content addressable memory, the medium comprising:
instructions for determining that a first search value is associated with a first range field;
instructions for determining a first bitmap associated with the first search value, wherein the first bitmap includes a first bit that indicates a first range encompassing the first search value;
instructions for generating a search key based on the first bitmap; and
instructions for accessing the ternary content addressable memory based on the search key.

* * * * *